United States Patent
Xu et al.

(10) Patent No.: US 9,864,699 B1
(45) Date of Patent: Jan. 9, 2018

(54) METHOD AND APPARATUS FOR COMPRESSING LUT

(71) Applicant: Marvell International Ltd., Hamilton (BM)

(72) Inventors: Wei Xu, Milpitas, CA (US); Fei Sun, Irvine, CA (US); Ka-Ming Keung, San Jose, CA (US); Jinjin He, Santa Clara, CA (US); Young-Ta Wu, Fremont, CA (US); Tony Yoon, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 7 days.

(21) Appl. No.: 15/098,904

(22) Filed: Apr. 14, 2016

Related U.S. Application Data

(60) Provisional application No. 62/147,127, filed on Apr. 14, 2015.

(51) Int. Cl.
  *G06F 12/1009* (2016.01)
  *G06F 12/121* (2016.01)
  *H03M 7/30* (2006.01)
(52) U.S. Cl.
  CPC ........ *G06F 12/1009* (2013.01); *G06F 12/121* (2013.01); *H03M 7/30* (2013.01); *G06F 2212/656* (2013.01); *G06F 2212/69* (2013.01)

(58) Field of Classification Search
  CPC ..... G06F 12/1009; G06F 12/121; H03M 7/30
  USPC .......................................... 711/154, 200–206
  See application file for complete search history.

(56) References Cited

U.S. PATENT DOCUMENTS

| | | | | |
|---|---|---|---|---|
| 5,426,750 | A * | 6/1995 | Becker ................ | G06F 12/1027 711/207 |
| 6,266,753 | B1 * | 7/2001 | Hicok ................. | G06F 12/1081 345/555 |
| 2008/0148002 | A1 * | 6/2008 | Fleming ................ | G06F 12/023 711/170 |
| 2013/0246689 | A1 * | 9/2013 | Matsudaira ......... | G06F 12/0246 711/103 |
| 2015/0095609 | A1 * | 4/2015 | Smith ..................... | G06F 12/10 711/206 |

* cited by examiner

*Primary Examiner* — David X Yi
*Assistant Examiner* — Nicholas Paperno

(57) ABSTRACT

Aspects of the disclosure provide a circuit that includes a memory circuit and a controller circuit. The memory circuit is to have a look-up table (LUT) that associates logical address used in computation with physical address used in storage space. The LUT includes a first level LUT with first level entries corresponding to logical addresses, each first level entry includes an indicator field and a content field, and the indicator field is indicative of a compressible/non-compressible attribute of a physical address associated with a logical address. The controller circuit is to receive a logical address, and translate the logical address into a physical address associated with the logical address based on the LUT.

18 Claims, 9 Drawing Sheets

US 9,864,699 B1

METHOD AND APPARATUS FOR COMPRESSING LUT

INCORPORATION BY REFERENCE

This present disclosure claims the benefit of U.S. Provisional Application No. 62/147,127, "COMPRESSED SSD LUT DATA STRUCTURE" filed on Apr. 14, 2015, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Look-up table (LUT) can be used to store a one-to-one mapping between address systems, such as a logical address system and a physical address system. In an example, a LUT includes a plurality of entries. Each entry corresponds to a logical address, and the content of the entry corresponds to a physical address.

SUMMARY

Aspects of the disclosure provide a circuit that includes a memory circuit and a controller circuit. The memory circuit is to have a look-up table (LUT) that associates logical address used in computation with physical address used in storage space. The LUT includes a first level LUT with first level entries corresponding to logical addresses, each first level entry includes an indicator field and a content field, and the indicator field is indicative of a compressible/non-compressible attribute of a physical address associated with a logical address. The controller circuit is to receive a logical address, and translate the logical address into a physical address associated with the logical address based on the LUT.

According to an aspect of the disclosure, when an indicator field of a first level entry corresponding to a logical address indicates the compressible attribute, a content field of the first level entry includes a compressed version of a physical address that maps to the logical address. The controller circuit is to receive a logical address. When an indicator field of a first level entry corresponding to the logical address is indicative of the compressible attribute, the controller circuit is to decompress a value in a content field of the first level entry to generate a physical address that maps to the received logical address.

Further, according to the disclosure, when an indicator field of a first level entry corresponding to a logical address indicates the non-compressible attribute, a content field of the first level entry includes a pointer that points to a second level entry in a second level LUT, and a combination of the first level entry and the second level entry forms a physical address that maps to the logical address. Then, the controller circuit is to receive a logical address. When an indicator field of a first level entry corresponding to the logical address is indicative of the non-compressible attribute, the controller circuit is to combine the first level entry with a second level entry pointed by the first level entry to generate a physical address that maps to the received logical address. In an embodiment, the second level LUT includes a linked list to organize available second level entries.

According to an aspect of the disclosure, the controller circuit is to receive a physical address that maps to a logical address, compress the physical address, and determine an indicator field of a first level entry corresponding to the logical address based on a size of the compressed physical address. In an example, the controller circuit is to store the compressed physical address in the first level entry when the size is smaller than a width of the content field and set the indicator field of the first level entry to the compressible attribute. Further, in an example, the controller circuit is to store the physical address in a combination of the first level entry and an additional entry when the size is larger than a width of the content field, link the additional entry with the first level entry, and set the indicator field of the first level entry to the non-compressible attribute.

Aspects of the disclosure provide a method. The method includes storing a look-up table (LUT) that associates logical address used in computation with physical address used for storage space. The LUT includes a first level LUT with first level entries corresponding to logical addresses, each first level entry includes an indicator field and a content field, and the indicator field is indicative of a compressible/non-compressible attribute of a physical address associated with a logical address. The method further includes receiving a logical address and translating the logical address into a physical address associated with the logical address based on the LUT.

Aspects of the disclosure provide an apparatus that includes processing circuitry, a storage device, and a controller circuit. The processing circuitry is to execute instructions based on logical addresses. The storage device has storage space allocated using physical addresses. The storage device stores a look-up table (LUT) that associates the logical addresses with the physical addresses. The LUT includes a first level LUT with first level entries corresponding to logical addresses, each first level entry includes an indicator field and a content field, and the indicator field is indicative of a compressible/non-compressible attribute of a physical address associated with a logical address. The controller circuit is to receive a logical address, and translate the logical address into a physical address associated with the logical address based on the LUT.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
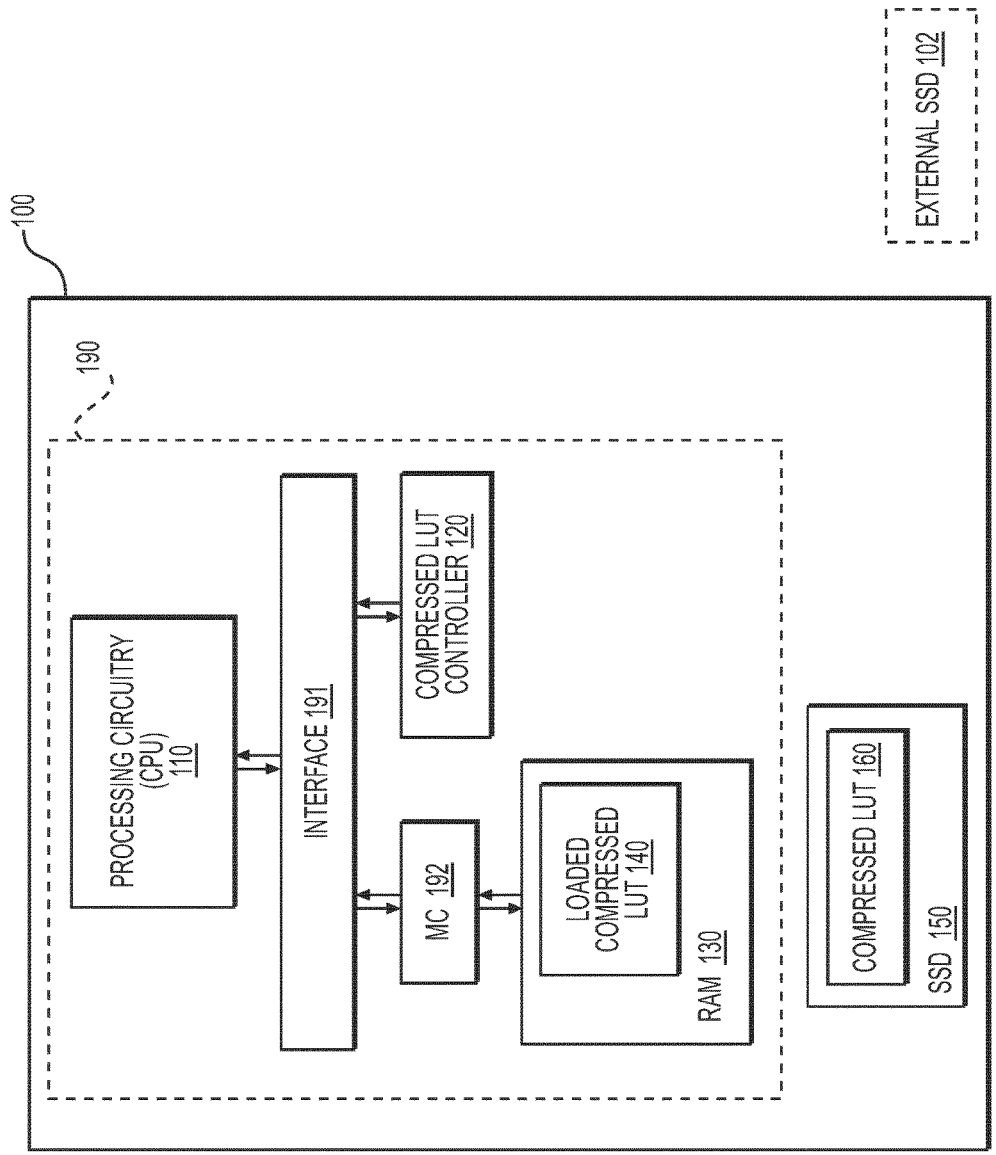
FIG. 1 shows a block diagram of an electronic device example 100 according to an embodiment of the disclosure.

FIG. 1 shows a block diagram of an electronic device example 100 according to an embodiment of the disclosure. The electronic device 100 uses a compressed look-up table (LUT), such as a compressed LUT 160, a loaded compressed LUT 140, and the like to store a mapping, such as a one-to-one mapping, between two address systems, such as logical addresses and physical addresses. Further, the electronic device 100 includes a controller, such as a compressed LUT controller 120, configured to use the mapping provided by the compressed LUT for address translation, and manage the mapping stored in the compressed LUT.

The electronic device 100 can be any suitable device, such as a desktop computer, a laptop computer, a tablet computer, a wearable device, a camera, a printer, and the like.

In the FIG. 1 example, the electronic device 100 includes a processing circuitry 110, an interface 191, a memory controller (MC) 192, a solid state drive (SSD) 150, a random access memory (RAM) 130, and the compressed LUT controller 120 coupled together as shown in FIG. 1.

The processing circuitry 110 is configured to execute system and application instructions and perform the arithmetic, logical, control and input/output (I/O) operations specified by the instructions. In an example, the processing circuitry 110 is a central processing unit (CPU). Generally, the processing circuitry 110 executes an application program using logical addresses that can be different from physical addresses of storage space in the electronic device 100.

The interface 191 couples the processing circuitry 110 with other components to enable transferring data between the processing circuitry 110 and the other components. The interface 191 can have any suitable topology, such as advanced microcontroller bus architecture (AMBA), advanced extensible interface (AXI), bus matrix topology, and the like.

The RAM 130 is readable and writeable and is the main memory for the processing circuitry 110. The RAM 130 can be implemented using any suitable random access memory, such as double data rate (DDR) dynamic random access memory (DRAM), and the like.

The memory controller 192 is configured to manage the flow of data going to and from the RAM 130. In an example, the memory controller 192 includes logic circuits to read and write to the RAM 130. The memory controller 192 can include other suitable logic circuits, such as logic circuit to refresh DRAM, and the like.

The SSD 150 provides storage space for the electronic device 100. The SSD 150 can be implemented using any suitable solid state memory, such as NAND-based flash memory, and the like. Generally, the SSD 150 has a relatively large storage space, such as 500 GB (Gigabytes), 1 TB (Terabytes), and the like. The storage space in the SSD 150 is allocated according to allocation unit (AU). In an example, AUs are of a same size, such as 1 KB, 4 KB (Kilobytes), 16 KB, 64 KB, and the like. The SSD 150 stores a look-up table, such as the compressed LUT 160, to map logical AU address (LAA) used by the processing circuitry 110 to physical AU address (PAA) used in the SSD 150. In an example, each LUT entry corresponds to an LAA, and represents one allocation unit; and the content of the LUT entry includes a corresponding PAA. The PAA encodes, for example, physical storage address in the SSD 150, including indicators for channel, device, logical unit number, block, row address, allocation unit in an NAND page, for example.

Generally, the RAM 130 has a relatively fast access speed than the SSD 150, but has a relatively small storage capacity. In an example, the RAM 130 has a size of 1 GB. In an embodiment, the data and the codes are loaded in the RAM 130 during operation, such that the processing circuitry 110 can access the RAM 130 for the codes and the data instead of the SSD 150. For example, the look-up table of the SSD 150 that maps the logical AU address (LAA) to physical AU address (PAA) is loaded in the RAM 130 during operation, such that the processing circuitry 110 can access the RAM 130 for the look-up table.

According to an aspect of the disclosure, the look-up table of the SSD 150, for example the compressed LUT 160, is implemented using a multi-level compressing technique, to reduce memory usage, such that when the compressed LUT 160 is loaded into the RAM 130 as the loaded compressed LUT 140, the memory space occupied by the loaded compressed LUT 140 in the RAM 130 is relatively small, and the remaining memory space of the RAM 130 can be used for other purpose, for example as a cache space to improve instruction execution efficiency. In a non-compression example, 1 GB storage space in SSD 150 can require 1 MB memory space for the look-up table, and thus 1 TB storage space in SSD 150 may require 1 GB memory space for the look-up table, and may occupy too much RAM space.

In the FIG. 1 example, the compressed LUT 160 or the loaded compressed LUT 140 is compressed LUT that each includes a first level LUT (LVL-1) and a second level LUT (LVL-2). The structure of the compressed LUT will be described in detail with reference to FIG. 2. Briefly, the first level LUT includes a plurality of first level entries. Each first level entry includes an indicator field and a content field, the indicator field is indicative of a compressible/non-compressible attribute of a PAA group (one or more PAAs) in the content field. For example, when the indicator field of the first level entry indicates the compressible attribute of the PAA group, the content field includes a compressed version of the PAA group. When the indicator field of the first level entry indicates the non-compressible attribute, the content field includes a pointer that points to a second level entry in the second level LUT. A combination of the contents of the first level entry and the second level entry can form the PAA group.

The compressed LUT controller 120 is configured to manage the compressed LUT, for example, to update the compressed LUT in response to a new allocation of storage space, and the like, and to use the compressed LUT to translate logical address into physical address. According to an aspect of the disclosure, the compressed LUT controller 120 is configured to make the loaded compressed LUT 140 to be transparent to the processing circuitry 110. For example, the operations of the compressed LUT controller 120 form a virtual uncompressed LUT for the processing circuitry 110, such that the processing circuitry 110 uses an un-compressed LUT address space. The compressed LUT controller 120 translates the virtual LUT access into physical compressed LUT access to the loaded compressed LUT 140.

It is noted that the electronic device 100 can include other suitable components that are not shown in FIG. 1, such as a display circuitry, a communication circuitry, a wireless communication circuitry and the like.

It is also noted that, in an example, an external SSD 102 can be coupled to the electronic device 100, and the external SSD 102 can include a compressed LUT similar to the compressed LUT 160.

It is noted that the electronic device 100 can be implemented using one or more integrated circuit (IC) chips. In an example, the electronic device 100 includes a system-on-chip (SOC) chip 190, and various components, such as the processing circuitry 110, the interface 191, the memory controller 192, the RAM 130 and the compressed LUT controller 120 can be integrated on the SOC chip 190. In an example, the SSD 150 can be an off chip component, and can include multiple IC chips.

It is noted that, in the FIG. 1 example, the compressed LUT controller 120 is connected with the interface 191. The compressed LUT controller 120 can be easily added in an existing SOC design. The virtual LUT access from the processing circuitry 110 is sent to the compressed LUT controller 120 by the interface 191. Then the compressed LUT controller translates the virtual LUT access into physical RAM access by the interface 191. Because both the physical compressed LUT and the virtual LUT are accessed via the interface 191, the interface 191 has address space for both the physical compressed LUT and the virtual LUT.

It is noted that the compressed LUT controller 120 can be coupled with the other components in other suitable manner.

Figure 2:
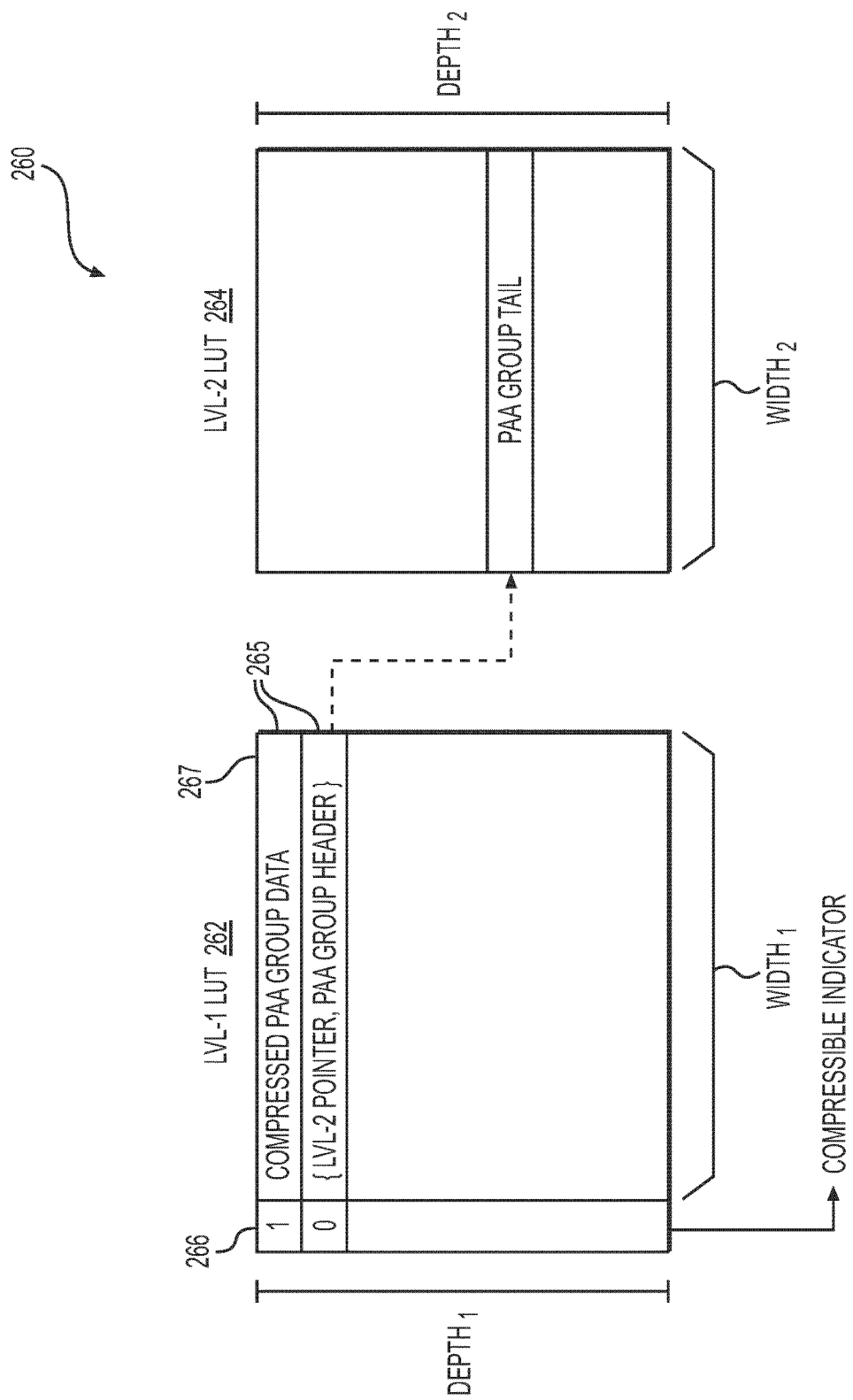
FIG. 2 shows a diagram of a look-up table example 260 according to an embodiment of the disclosure.

FIG. 2 shows a diagram of a compressed LUT example 260 according to an embodiment of the disclosure. The compressed LUT 160 and the loaded compressed LUT 140 in the FIG. 1 example can be implemented according to the compressed LUT 260.

The compressed LUT 260 includes a first level LUT (LVL-1 LUT) 262 and a second level LUT (LVL-2 LUT) 264. The first level LUT 262 includes a plurality of first level entries 265. In an example, the number of first level entries (DEPTH$_1$) is a ratio of the total number (N_LAA) of LAAs to the number (N_PAAperENTRY) of PAAs per LUT entry. In an example, each LUT entry includes a plurality of PAAs, such as the number (N_PAAperENTRY) of PAAs, and the plurality of PAAs can be referred to as a PAA group. Each of the first level entry 265 includes an indicator field 266 and a content field 267. The indicator field 266 is used to store one or more indicators, such as a compressible indicator, and the like. In an example, the indicator field 266 has a width of one byte. The compressible indicator is used to indicate whether the PAA group is compressible to be stored in the content field 267 or is non-compressible for the content field 267.

The content field 267 is configured to have a width (WIDTH$_1$) smaller than the width (WIDTH) of the PAA group without compression. In an example, the width (WIDTH) of the PAA group without compression equals the width of one PAA multiplying the number of PAAs in the PAA group. The content field 267 is used to store compressed PAA group when the PAA group is compressible and store a portion of the PAA group when the PAA group is non-compressible. In an example, the width (WIDTH$_1$) of the content field 267 is half of the width of the PAA group. It is noted that the width of the content field 267 can be any suitable value.

In an embodiment, a compression threshold (THRESHOLD) that is smaller than the width (WIDTH) of the PAA group is predefined and the width (WIDTH$_1$) of the content field 267 is equal to the compression threshold. When a PAA group is compressed to have an equal size as or a smaller size than the compression threshold, the PAA group is compressible; otherwise, the PAA group is non-compressible.

In an example, to store a mapping between an LAA and a PAA, a first level LUT entry including the LAA is identified. When the PAA group including the PAA is compressible, the PAA group is compressed and the compressed PAA group is stored in the content field 267 in the identified first level LUT entry, and the compressible indicator in the indictor field 266 of the identified first level LUT entry is set to indicate the compressible attribute. When the PAA group is non-compressible, an available entry in the second level LUT 264 is allocated and linked with the first level LUT entry to store the PAA group without compression. In an example, a second level entry can be identified by a four-byte pointer. Thus, the first level LUT entry stores the four-byte pointer (e.g., LVL-2 pointer) pointing to the allocated second level LUT entry, and a header portion (e.g., PAA group header) of the PAA group without compression, and the rest of the PAA group (e.g., PAA group tail) is stored in the allocated second level LUT entry. In the example, the width (WIDTH$_2$) of the second level LUT entry is expressed in Eq. 1

$$\text{WIDTH}_2 = \text{WIDTH} + 4 - \text{WIDTH}_1 \quad \text{Eq. 1}$$

In an example, the depth (DEPTH$_2$) of the second level LUT 264 depends on the PAA group compression quality, and can be much smaller than the depth of the first level LUT 262, and thus memory space can be saved.

According to an aspect of the disclosure, for a read operation to translate an LAA to a PAA based on the compressed LUT 260, the first level LUT 262 is accessed first. The first level LUT 262 has a uniform entry size (e.g., THRESHOLD+1 bytes) for a set of LAAs. Thus, giving the LAA, the offset address of a first level LUT entry corresponding to the LAA can be calculated using Eq. 2:

$$\text{offset} = \text{floor}\left(\frac{LAA}{\text{N\_PAAperENTRY}}\right) \times (\text{THRESHOLD} + 1) \quad \text{Eq. 2}$$

Then, the first level LUT entry with the offset address is accessed for the read operation. When the compressible indicator in the indictor field 266 of the first level LUT entry indicates compressible attribute, the first level LUT entry stores the compressed PAA group in the content field. Thus, the compressed PAA group in the content field 267 of the first level LUT entry is decompressed to generate the PAA group. Further, the PAA in the PAA group that maps to the LAA can be determined.

When the compressible indicator in the indicator field of the first level LUT entry indicates the non-compressible attribute, the first level LUT entry stores a pointer pointing to a second level LUT entry and the header of the PAA group without compression. The pointer is used to locate the second level LUT entry that stores the tail of the PAA group without compression. The header of the PAA group and the tail of the PAA group are combined to form the PAA group. Further, the PAA in the PAA group that maps to the LAA can be determined.

According to an aspect of the disclosure, for a write operation to write a mapping between an LAA and a PAA in the compressed LUT 260, the offset address of a first level LUT entry corresponding to the LAA can be calculated using Eq. 2 to identify the first level LUT entry. Further, the PAA group that includes the PAA is formed and is compressed. When the size of the compressed PAA group is equal to or smaller than the THRESHOLD, the compressed PAA group is stored in the content field 267 of the first level LUT entry, and the compressible indicator in the indicator field 266 of the first level LUT entry is set to indicate the compressible attribute.

When the size of the compressed PAA group is larger than THRESHOLD, a second level LUT entry is allocated to store, for example, the tail portion of the PAA group without compression, a pointer that points to the second level LUT entry and header portion of the PAA group without compression are stored in the content field 267 of the first level LUT entry. Further, the compressible indicator in the indicator field 266 of the first level LUT entry is cleared to indicate the non-compressible attribute in an example.

In an embodiment, an update operation can be performed on the compressed LUT 260. For example, to update a mapping of an LAA to a new PAA, a read operation to read a mapping of the LAA to an old PAA is performed first based on the compressed LUT 260. Then, the mapping is modified to map the LAA to the new PAA. Further, a write operation to write the modified mapping is performed based on the LUT 260.

It is noted that, in an example, the second level LUT is used for the non-compressible PAA groups. The second level LUT can be managed dynamically for entry allocation and retirement.

Figure 3:
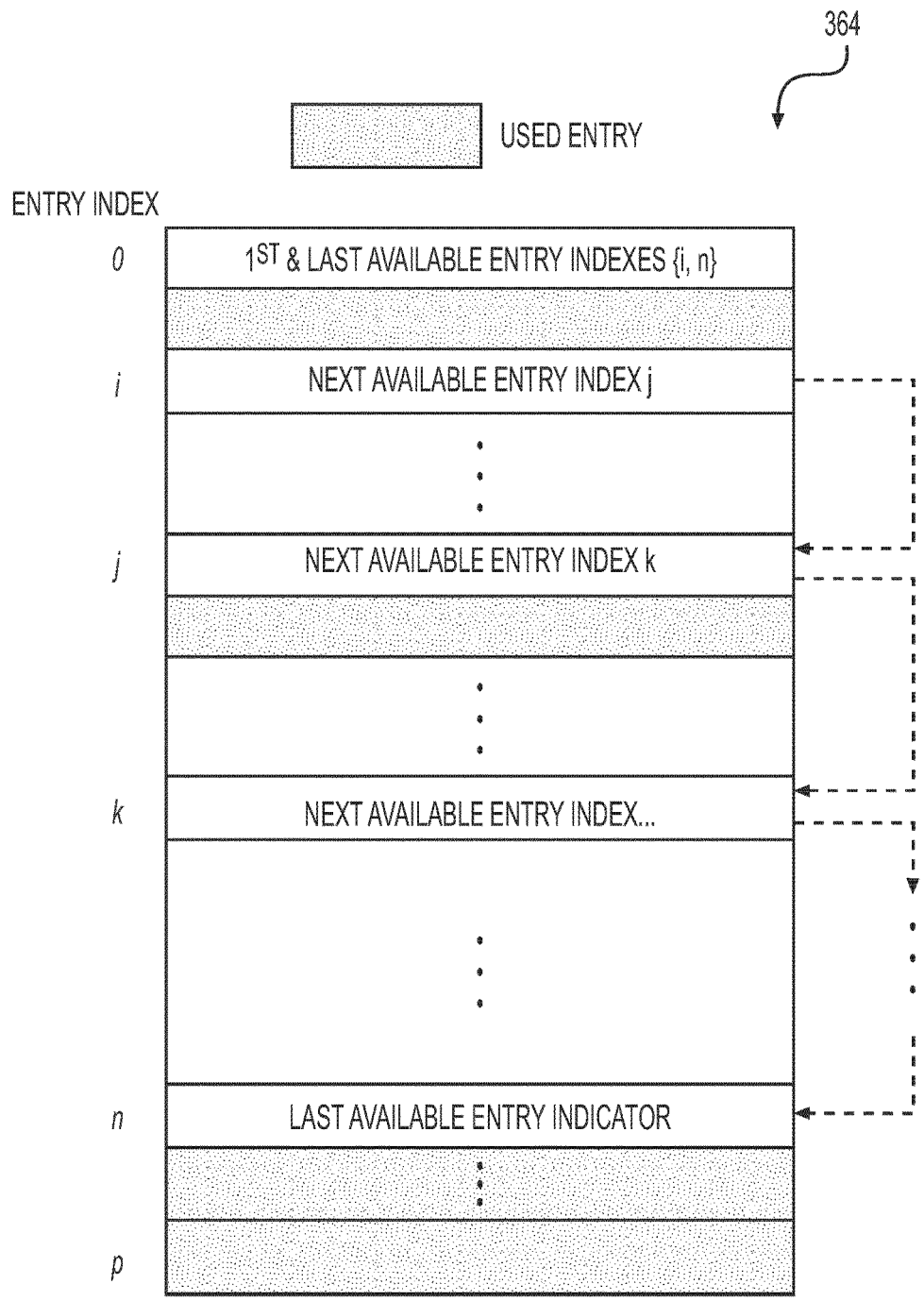
FIG. 3 shows a diagram of a second level look-up table 364 according to an embodiment of the disclosure.

FIG. 3 shows a data structure diagram of a second level LUT 364 according to an embodiment of the disclosure. In an example, the second level LUT 364 can be used in the FIG. 2 example as the second level LUT 264.

The second level LUT 364 includes used entries (shaded) and available entries (unshaded). The used entries are linked to entries in the first level LUT (not shown). The available entries are organized as a linked list (e.g., i→j→k . . . →n). Each node in the linked list is an available entry, and the content of an available entry is an index to a next available entry. The last node or last available entry doesn't point to any node. The linked list has a header node (e.g. entry with index 0), and the content of the header node include the index to the first node (e.g., entry with index i), and the index to the last node (e.g., entry with index n).

To allocate an available entry, the first available entry (e.g., entry with index i) is allocated and then removed from the linked list for a new non-compressible LUT entry, and the header node is updated, for example to replace i with j. To add a retired entry (e.g., entry with index p) in the linked list, the index (index p) of the retired entry is written to the present last node (index n) and the header node (index 0) is updated, for example to replace n with p.

Specifically, in an example, to allocate an available entry for a non-compressible PAA group from the second level LUT 364, the entry with index 0 is read to obtain the index (e.g., i) of the first node in the listed list. Then, the entry (e.g., index i) of the first node is read to obtain the index (e.g., j) of a second node. The index (e.g., j) of the second node is written into the entry with index 0, such that the previous second node becomes the present first node. Further, in the example, the entry with the index i is used for storing the tail of the non-compressible PAA group for example.

Specifically, in an example, in response to a retirement of an entry with an index (e.g., index p), the entry with index 0 is read to obtain the index (e.g., n) of the last node in the linked list. Then, the index (e.g., p) of the retired entry is written into the last node to add the retired entry at the end of the linked list. Further, the index (e.g., p) of the retired entry is written, for example to replace the index n in the entry with index 0.

Figure 4:
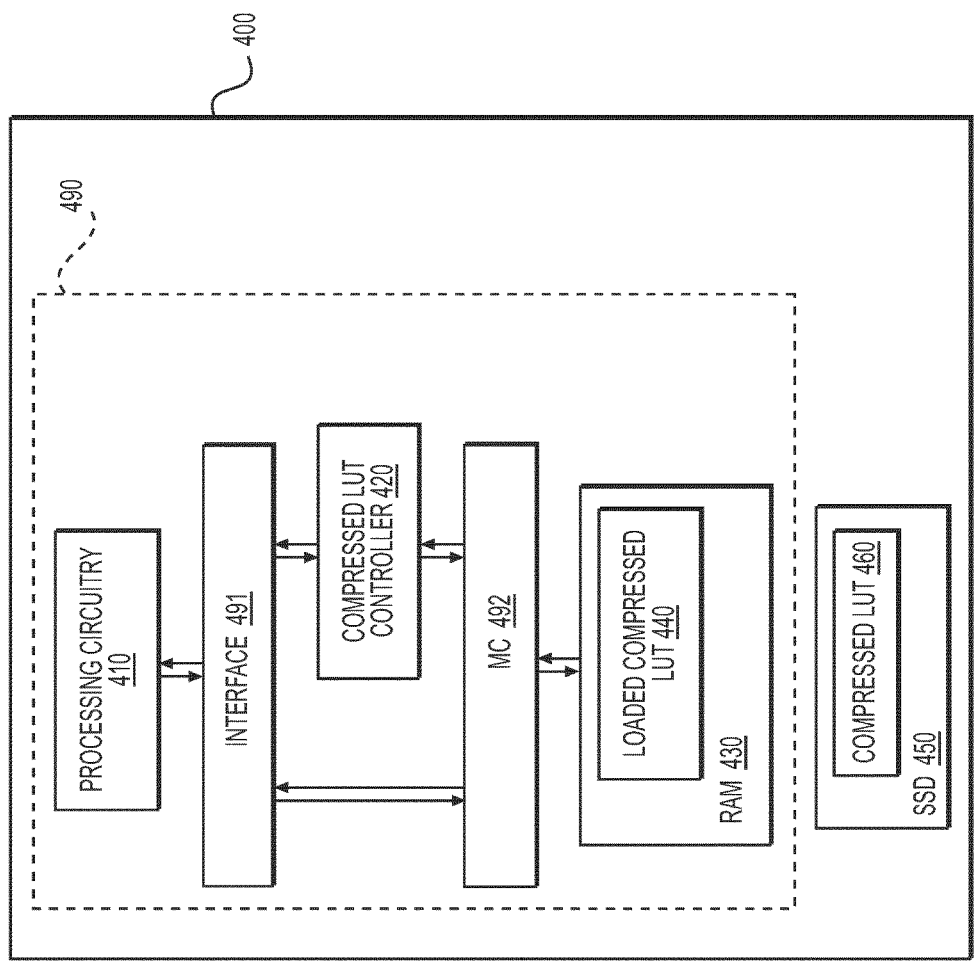
FIG. 4 shows a block diagram of another electronic device example 400 according to an embodiment of the disclosure.

FIG. 4 shows a block diagram of another electronic device example 400 according to an embodiment of the disclosure. The electronic device 400 operates similarly to the electronic device 100 described above. The electronic device 400 utilizes certain components that are identical or equivalent to those used in the electronic device 100; the description of these components has been provided above and will be omitted here for clarity purposes.

However, in this embodiment, the compressed LUT controller 420 is connected between the interface 491 and the memory controller 492. The virtual LUT access from the processing circuitry 110 is sent to the compressed LUT controller 420 by the interface 491. The compressed LUT controller 420 translates the virtual LUT address into physical RAM address and then access the RAM 430 directly. The address space of the compressed LUT can be hidden by the virtual LUT when the compressed LUT in the RAM 430 is not need to be visible to the processing circuitry 410. In this example, the memory controller 492 is redesigned to add an extra port for coupling the compressed LUT controller 420.

Figure 5:
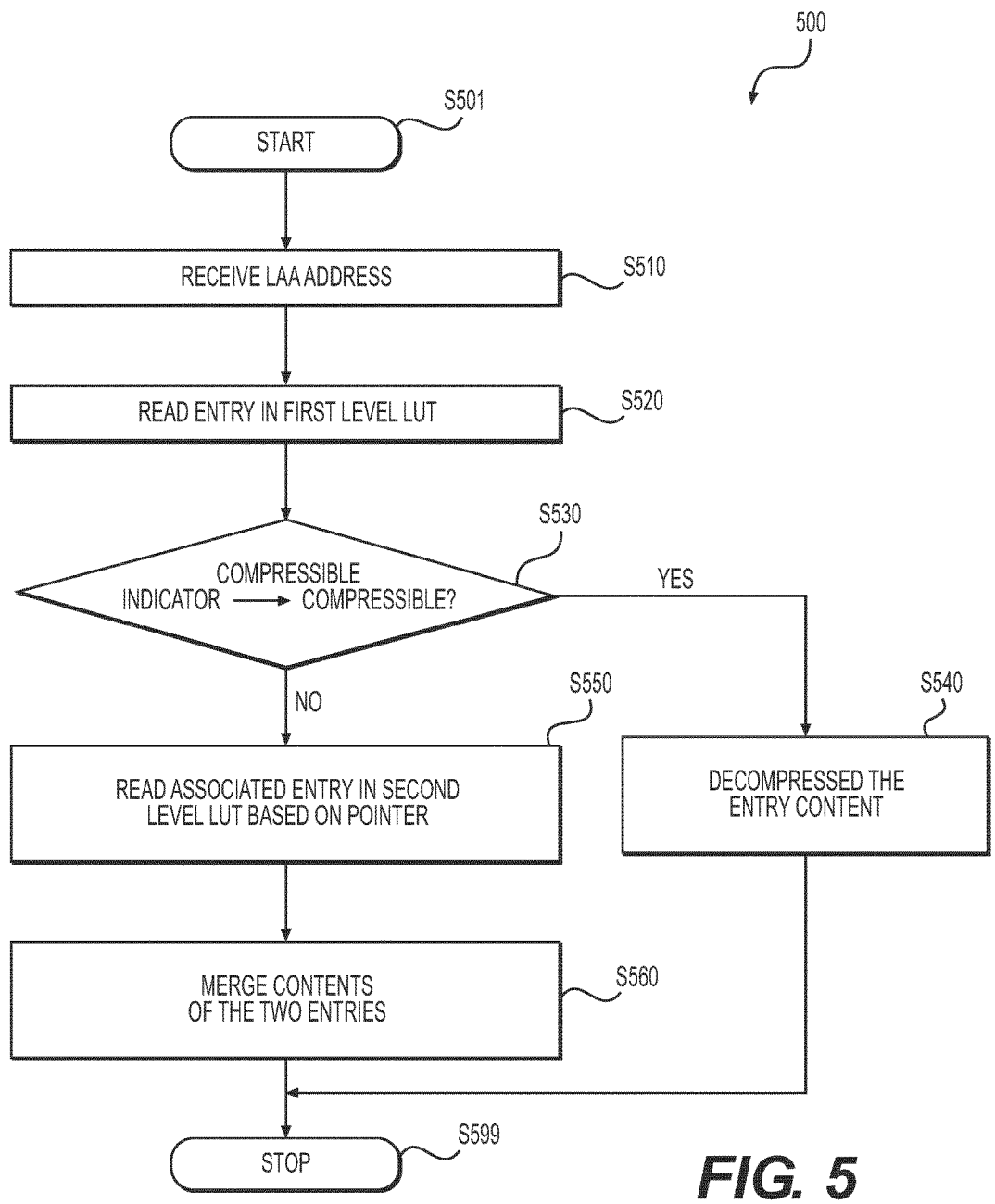
FIG. 5 shows a flow chart outlining a process example 500 according to an embodiment of the disclosure.

FIG. 5 shows a flow chart outlining a process example 500 for translating a logical address into a physical address based on a compressed LUT according to an embodiment of the disclosure. In an example, the process 500 is executed by a compressed LUT controller, such as the compressed LUT controller 120, the compressed LUT controller 420, and the like. The process starts at S501 and proceeds to S510.

At S510, a logical address is received. In an example, the compressed LUT controller 120 receives a logical AU address from the processing circuitry 110 via the interface 191.

At S520, a first level LUT entry corresponding to the logical AU address is accessed. In an example, an offset is calculated, for example, according to Eq. 2. Then, the offset is used to access the first level LUT entry. The first level LUT entry includes an indictor field and a content field.

At S530, the compressed LUT controller determines whether the compressible indictor is indicative of compressible. When the compressible indictor is indicative of compressible, the process proceeds to S540; otherwise, the process proceeds to S550.

At S540, the value stored in the content field is decompressed to generate the physical AU address that maps to the logical AU address. In an example, the value stored in the content field is decompressed into a group of physical AU addresses. Then, from the group of physical AU addresses, the physical AU address that maps to the logical AU address can be determined. The process then proceeds to S599 and terminates.

At S550, a second level LUT entry in the second level LUT is accessed based on a pointer. In an example, the pointer is extracted from the content field of the first level LUT entry, and second level LUT entry pointed by the pointer is accessed.

At S560, the contents of the first level LUT entry and the second level LUT entry are merged to generate the physical AU address that maps to the logical AU address. In an example, the first level LUT entry stores the pointer and a header portion of a group of the physical AU addresses in the content field and the second level LUT entry stores a tail portion of the group of the physical AU addresses. The header portion and the tail portion are merged to generate the group of the physical AU addresses. Further, from the group of physical AU addresses, the physical AU address that maps to the logical AU address is selected. Then, the process proceeds to S599 and terminates.

Figure 6:
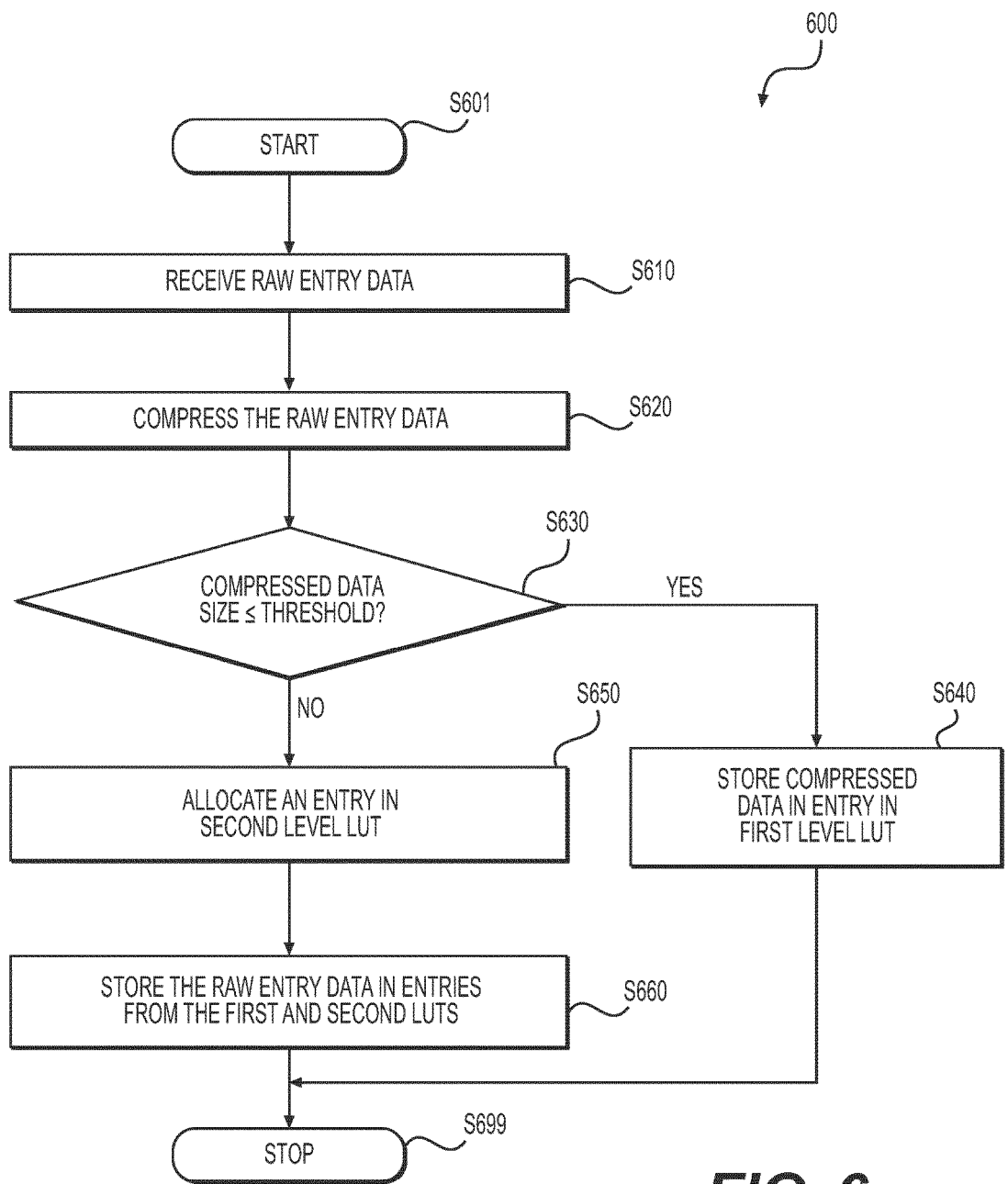
FIG. 6 shows a flow chart outlining a process example 600 according to an embodiment of the disclosure.

FIG. 6 shows a flow chart outlining a process example 600 for writing a mapping between a logical address and a physical address into a compressed LUT according to an embodiment of the disclosure. In an example, the process 600 is executed by a compressed LUT controller, such as the compressed LUT controller 120, the compressed LUT controller 420, and the like. The process starts at S601 and proceeds to S610.

At S610, raw entry data is received. In an example, the compressed LUT controller receives a logical AU address and a physical AU address. The logical AU address can be used to identify a first level LUT entry in the first level LUT. In an example, one entry is used to store a group of physical AU addresses. In the example, an offset is calculated, for example, according to Eq. 2. Then, the offset is used to identify the first level LUT entry corresponding to the logical AU address. In the example, the raw entry data includes a group of physical AU addresses for the first level LUT entry.

At S620, the raw entry data (the group of physical AU addresses) is compressed.

At S630, the compressed LUT controller determines whether the size of the compressed data is smaller than or equal to a compression threshold (THRESHOLD). In an example, the compression threshold is equivalent to the width of the content field of the first level LUT entry. When the size of the compressed data is smaller than or equal to the compression threshold, the process proceeds to S640; otherwise, the process proceeds to S650.

At S640, the compressed data is stored in the first level LUT entry. Then the process proceeds to S699 and terminates.

At S650, a second level LUT entry is allocated. In an example, available second level LUT entries are organized in a linked list. One of the second level LUT entries is removed from the linked list and allocated for storing the group of physical AU addresses with the first level LUT entry.

At S660, the raw entry data is stored in a combination of the first level LUT entry and the second level LUT entry. In an example, the group of physical AU addresses is split into a header portion and a tail portion. The header portion and a pointer pointing to the second level LUT entry are stored in the content field of the first level LUT entry, and the tail portion is stored in the second level LUT entry. Then, the process proceeds to S699 and terminates.

According to an aspect of the disclosure, the compressed LUT controller 120 and the compressed LUT controller 420 can be implemented using any suitable techniques, such as caching technique, and the like to further improve LUT access efficiency.

Figure 7:
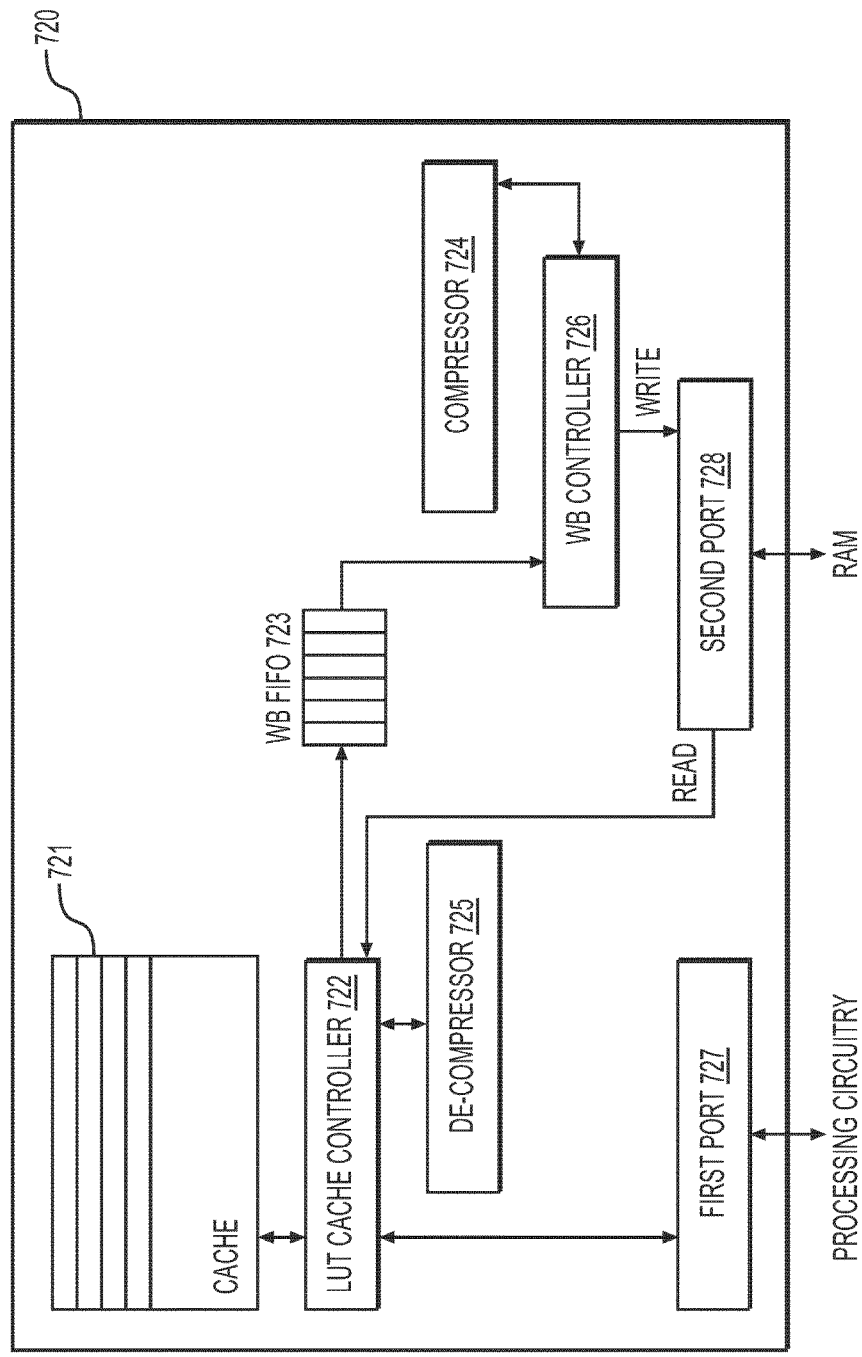
FIG. 7 shows a block diagram of a compressed LUT controller 720 according to an embodiment of the disclosure.

FIG. 7 shows a block diagram of a compressed LUT controller 720 according to an embodiment of the disclosure. In an example, the compressed LUT controller 720 can be used in the FIG. 4 example as the compressed LUT controller 420.

The compressed LUT controller 720 includes a first port 727 to be accessed by a processing circuitry, and a second port 728 to be accessed by a RAM. In an example, the first port 727 is coupled to the processing circuitry via a bus interface, and the second port is coupled to the RAM via a memory controller. Further, the compressed LUT controller 720 includes a compressor 724, a de-compressor 725, a cache 721, a LUT cache controller 722, a writeback (WB) first-in-first-out (FIFO) queue 723 and a WB controller 726. These elements are coupled together as shown in FIG. 7.

In an example, the compressor 724 is a compression engine configured to compress an input (e.g., a group of physical AU addresses) according to a suitable compression algorithm to generate an output (e.g., a compressed group of physical AU addresses). The de-compressor 725 is a decompression engine configured to de-compress an input (e.g., a compressed group of physical AU addresses) according to a suitable decompression algorithm to generate an output (e.g., a group of physical AU addresses). The cache 721 is configured to cache decompressed LUT entries, such as entries with decompressed physical AU addresses that map to logical AU addresses. The WB FIFO queue 723 queues entries to be written back to the RAM.

According to an aspect of the disclosure, the compressed LUT controller 720 uses cache technique to reduce LUT read and write latency. The LUT cache controller 722 manages operations to the cache 721, and the WB controller manages operations to write back to the RAM. The operations are discussed with reference to FIG. 8 and FIG. 9.

Figure 8:
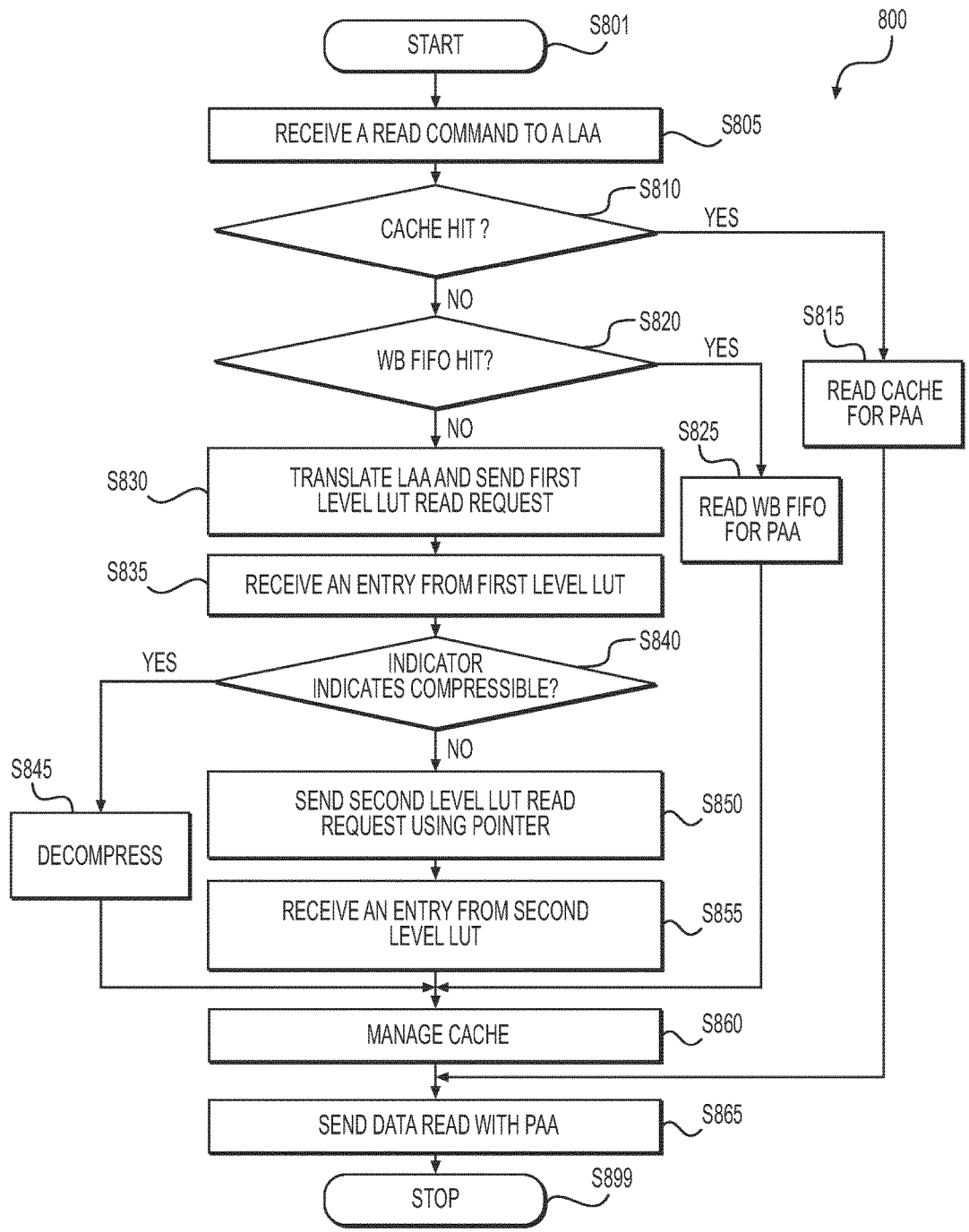
FIG. 8 shows a flow chart outlining a process example 800 according to an embodiment of the disclosure.

FIG. 8 shows a flow chart outlining a process example 800 executed in the compressed LUT controller 720 according to an embodiment of the disclosure. The process starts at S801 and proceeds to S805.

At S805, a read command to a logical AU address is received. In an example, the LUT cache controller 722 receives the read command from the processing circuitry via the interface.

At S810, the LUT cache controller 722 determines whether the cache 721 has a cache hit in response to the received read command for the logical AU address. When the cache 721 stores an entry with decompressed physical AU address that maps to the logical AU address, the cache 721 has a cache hit, and process proceeds to S815; otherwise, the process proceeds to S820.

At S815, the physical AU address in the cache 721 is read. The process proceeds to S865.

At S820, the LUT cache controller 722 determines whether the WB FIFO queue 723 has a hit in response to the received read command for the logical AU address. When the WB FIFO queue 723 stores an entry with decompressed physical AU address that maps to the logical AU address, the WB FIFO 723 has a hit, and process proceeds to S825; otherwise, the process proceeds to S830.

At S825, the physical AU address in the WB FIFO queue 723 is read. The process proceeds to S860.

At S830, the logical AU address is translated into an offset and a first level LUT read request of the offset is sent to the RAM via the memory controller.

At S835, the LUT cache controller 722 receives a first level LUT entry from the first level LUT.

At S840, the LUT cache controller 722 determines whether a compressible indicator in the first level LUT entry indicates compressible. When the compressible indicator is indicative of the compressible, the process proceeds to S845; otherwise, the process proceeds to S850.

At S845, the de-compressor 725 decompresses the value in the content field of the first level LUT entry to generate the decompressed group of physical AU addresses. The process proceeds to S860.

At S850, a pointer stored in the content field of the first level LUT entry is obtained, and a read request to a second level LUT entry pointed by the pointer is sent to the RAM via the memory controller.

At S855, the LUT cache controller 722 receives the second level LUT entry pointed by the pointer from the RAM via the memory controller. The contents of the first level LUT entry and the second level LUT entry are combined to generate a group of physical AU addresses that includes the physical AU address mapping the logical AU address.

At S860, the LUT cache controller 722 manages the cache 721. In an embodiment, the LUT cache controller 722 uses suitable techniques to search for an available cache line in the cache 721 and write the physical AU address or the group of physical AU addresses in the available cache line.

At S865, a read request with the physical AU address is sent to the memory controller to read the data stored at the physical AU address. When the data is received, the data is sent to the processing circuitry via the interface. Then the process proceeds to S899 and terminates.

It is noted that the process 800 can be suitably modified for operations in response to a write command from the processing circuitry to write data to a logical address.

Figure 9:
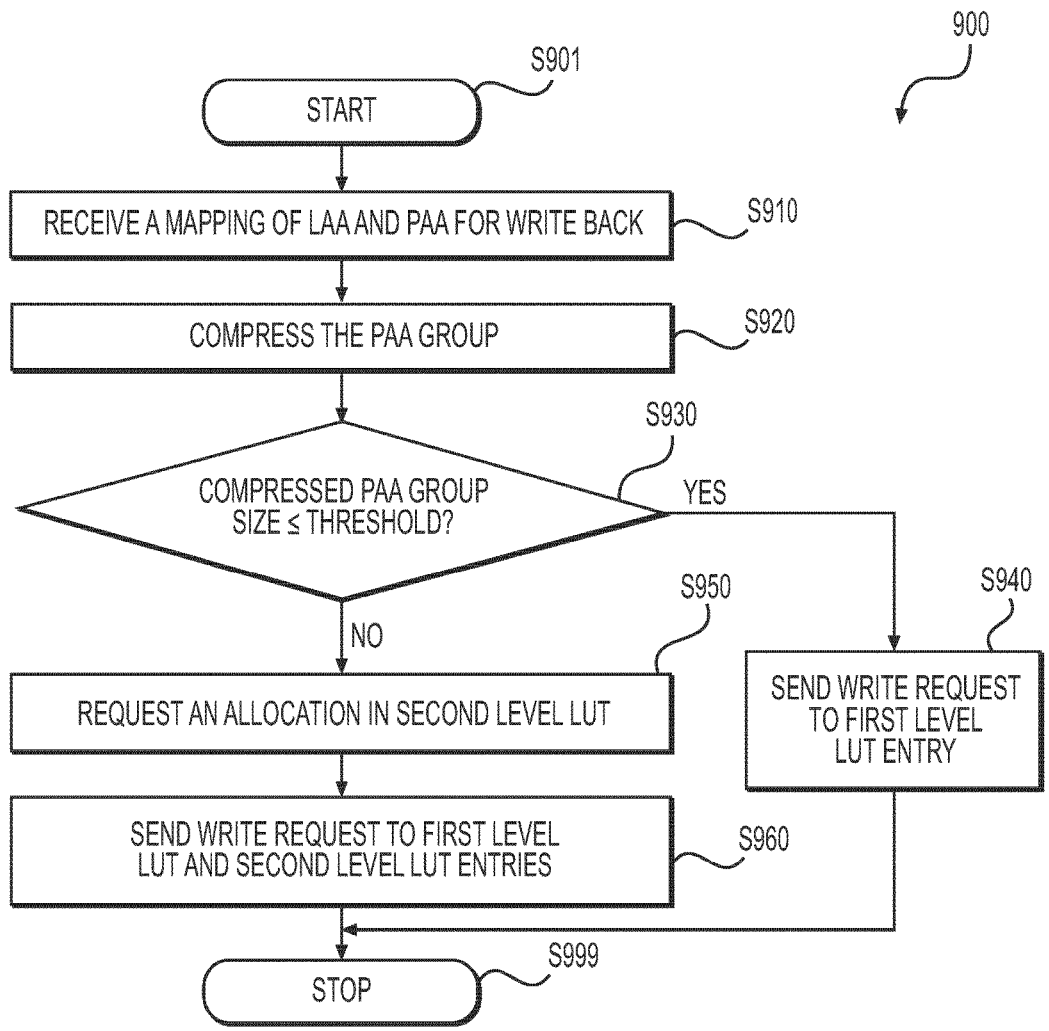
FIG. 9 shows a flow chart outlining a process example 900 according to an embodiment of the disclosure.

FIG. 9 shows a flow chart outlining a process 900 executed in the compressed LUT controller 720 according to an embodiment of the disclosure. The process starts at S901 and proceeds to S910.

At S910, the WB controller 726 receives a mapping of a logical AU address to a physical AU address for write-back to the RAM.

At S920, the compressor 724 compresses a group of physical AU addresses that includes the received physical AU address. In an example, the physical AU address is combined with other physical AU addresses to form the group of physical AU addresses for an LUT entry. The group of physical AU addresses are then compressed.

At S930, the WB controller 726 determines whether the size of the compressed group of physical AU addresses is equal to or smaller than a threshold. When the size of the compressed group of physical AU addresses is equal to or smaller than the threshold, the process proceeds to S940; otherwise, the process proceeds to S950.

At S940, a write request to write the compressed group of physical AU addresses to a first LUT entry corresponding to the logical AU address is sent to the RAM via the memory controller. In an example, the compressed group of physical AU addresses is stored in the content field of the first level LUT entry, and the indicator field of the first level LUT entry is set to indicate compressible. Then the process proceeds to S999 and terminates.

At S950, a second level LUT entry is allocated. The second level LUT entry is located by a pointer pointing to the second level LUT entry.

At S960, a write request to write to the first level LUT entry corresponding to the logical AU address and a write request to write to the second level LUT entry are sent to the RAM via the memory controller. In an example, the pointer to the second level LUT entry and a header portion of the group of physical AU addresses are combined and written to the content field of the first level LUT entry, and the indicator field of the first level LUT entry is set to indicate non-compressible. The tail portion of the group of physical AU addresses is written to the second level LUT entry. Then the process proceeds to S999 and terminates.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
   a memory circuit to have a look-up table (LUT) that associates logical address used in computation with physical address used in storage space, wherein the LUT includes a first level LUT with first level entries corresponding to logical addresses, each first level entry includes an indicator field and a content field, the indicator field is indicative of an attribute of a physical address associated with a logical address; and
   a controller circuit to receive a logical address, and translate the logical address into a physical address associated with the logical address based on the LUT and receive a physical address that maps to a logical address, compress the physical address, and determine an indicator field of a first level entry corresponding to the logical address based on a size of the compressed physical address.

2. The circuit of claim 1, wherein when an indicator field of a first level entry corresponding to a logical address indicates a compressible attribute, a content field of the first level entry includes a compressed version of a physical address that maps to the logical address.

3. The circuit of claim 2, wherein the controller circuit is to receive a logical address, when an indicator field of a first level entry corresponding to the logical address is indicative of the compressible attribute, decompress a value in a content field of the first level entry to generate a physical address that maps to the received logical address.

4. The circuit of claim 1, wherein when an indicator field of a first level entry corresponding to a logical address indicates a non-compressible attribute, a content field of the first level entry includes a pointer that points to a second level entry in a second level LUT, and a combination of the first level entry and the second level entry forms a physical address that maps to the logical address.

5. The circuit of claim 4, wherein the controller circuit is to receive a logical address, when an indicator field of a first level entry corresponding to the logical address is indicative of the non-compressible attribute, the controller circuit is to combine the first level entry with a second level entry pointed by the first level entry to generate a physical address that maps to the received logical address.

6. The circuit of claim 4, wherein the second level LUT comprises a linked list to organize available second level entries.

7. The circuit of claim 1, wherein the controller circuit is to store the compressed physical address in the first level entry when the size is smaller than a width of the content field and set the indicator field of the first level entry to a compressible attribute.

8. The circuit of claim 1, wherein the controller circuit is to store the physical address in a combination of the first level entry and an additional entry when the size is larger than a width of the content field, link the additional entry with the first level entry, and set the indicator field of the first level entry to a non-compressible attribute.

9. A method, comprising:
   storing a look-up table (LUT) that associates logical address used in computation with physical address used for storage space, wherein the LUT includes a first level LUT with first level entries corresponding to logical addresses, each first level entry includes an indicator field and a content field, the indicator field is indicative of an attribute of a physical address associated with a logical address; and receiving a logical address;

translating the logical address into a physical address associated with the logical address based on the LUT;

receiving a physical address that maps to a logical address;

compressing the physical address; and determining an indicator field of a first level entry corresponding to the logical address based on a size of the compressed physical address.

10. The method of claim 9, wherein when an indicator field of a first level entry corresponding to a logical address indicates a compressible attribute, a content field of the first level entry includes a compressed version of a physical address that maps to the logical address, and the method comprises:

receiving a logical address; and decompressing, when an indicator field of a first level entry corresponding to the logical address is indicative of the compressible attribute, a value in a content field of the first level entry to generate a physical address that maps to the received logical address.

11. The method of claim 9, wherein when an indicator field of a first level entry corresponding to a logical address indicates a non-compressible attribute, a content field of the first level entry includes a pointer that points to a second level entry in a second level LUT, and a combination of the first level entry and the second level entry forms a physical address that maps to the logical address, and the method comprises:

receiving a logical address; and combining, when an indicator field of a first level entry corresponding to the logical address is indicative of the non-compressible attribute, the first level entry with a second level entry pointed by the first level en to generate a physical address that maps to the received logical address.

12. The method of claim 9, further comprising:

storing the compressed physical address in the first level entry when the size is smaller than a width of the content field; and setting the indicator field of the first level entry to a compressible attribute.

13. The method of claim 9, further comprising:

allocating a second level entry when the size is larger than a width of the content field;

storing the physical address in a combination of the first level entry and the second level entry;

linking the second level entry with the first level entry; and setting the indicator field of the first level entry to a non-compressible attribute.

14. The method of claim 13, wherein allocating the second level entry when the size is larger than the width of the content field further comprises:

removing an entry from a linked list that links available second level entries for a second level LUT; and allocating the removed entry for the second level entry.

15. An apparatus, comprising:

processing circuitry to execute instructions based on logical addresses;

a storage device with storage space allocated using physical addresses, the storage device stores a look-up table (LUT) that associates the logical addresses with the physical addresses, wherein the LUT includes a first level LUT with first level entries corresponding to logical addresses, each first level entry includes an indicator field and a content field, the indicator field is indicative of an attribute of a physical address associated with a logical address; and a controller circuit to receive a logical address, and translate the logical address into a physical address associated with the logical address based on the LUT and receive a physical address that maps to a logical address, compress the physical address, and determine an indicator field of a first level entry corresponding to the logical address based on a size of the compressed physical address.

16. The apparatus of claim 15, wherein the storage device is solid state drive.

17. The apparatus of claim 16, further comprising:

a memory circuitry to be loaded with the LUT to be accessed by the processing circuitry.

18. The apparatus of claim 15, wherein the controller circuit comprises:

a cache circuit to cache at least one entry of the LUT; and a cache controller to dynamically manage the at least one entry of the LUT in the cache circuit.

* * * * *